United States Patent
Schrama et al.

(10) Patent No.: US 10,340,310 B2
(45) Date of Patent: Jul. 2, 2019

(54) SOURCE SENSITIVE OPTIC WITH RECONFIGURABLE CHIP-ON-BOARD LIGHT EMITTING DIODE ARRAY

(71) Applicant: Lumileds LLC, San Jose, CA (US)

(72) Inventors: Charles Schrama, San Jose, CA (US); Varun Dev Kakkar, Eindhoven (NL); Erno Fancsali, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/793,655

(22) Filed: Oct. 25, 2017

(65) Prior Publication Data

US 2019/0123095 A1    Apr. 25, 2019

(51) Int. Cl.
| | |
|---|---|
| F21V 23/06 | (2006.01) |
| H01L 27/15 | (2006.01) |
| F21V 14/00 | (2018.01) |
| F21K 9/66 | (2016.01) |

(52) U.S. Cl.
CPC .............. *H01L 27/156* (2013.01); *F21K 9/66* (2016.08); *F21V 14/006* (2013.01)

(58) Field of Classification Search
CPC ......... H01L 27/156; F21K 9/66; F21V 14/006
USPC ....................................................... 362/231
See application file for complete search history.

(56) References Cited

U.S. PATENT DOCUMENTS

| | | |
|---|---|---|
| 8,646,956 B2 | 2/2014 | Hering et al. |
| 9,593,823 B2 | 3/2017 | Schadt et al. |
| 2012/0189291 A1 | 7/2012 | Von Malm et al. |
| 2014/0049956 A1* | 2/2014 | Manahan ................ F21V 21/14 362/233 |
| 2015/0097200 A1 | 4/2015 | Bergmann et al. |

(Continued)

FOREIGN PATENT DOCUMENTS

| | | |
|---|---|---|
| DE | 102011107893 A1 | 1/2013 |
| DE | 202015106996 | 3/2017 |
| DE | 202015106996 U1 | 3/2017 |

(Continued)

OTHER PUBLICATIONS

"International Application Serial No. PCT/US2018/057477, International Search Report dated Feb. 18, 2019", 5 pgs.

(Continued)

*Primary Examiner* — Karl D Frech
(74) *Attorney, Agent, or Firm* — Schwegman Lundberg & Woessner, P.A.

(57) ABSTRACT

Described herein is source sensitive optic that uses reconfigurable chip-on-board (CoB) light emitting diode (LED) arrays as light sources. In an implementation, the reconfigurable CoB LED array includes a predetermined number of LEDs that are configurable for a variety of illumination scenarios. In an implementation, the reconfigurable CoB LED array is multiple CoB LED arrays that are configured for use with the source sensitive optic as described herein. The source sensitive optic includes surface shapes that are responsive to the reconfigurable CoB LED array. The source sensitive optic is configured to provide beam profile and radiation pattern differentiation based on a CoB LED array configuration configured from the reconfigurable CoB LED. Each configurable CoB LED array configuration radiates a different beam pattern via the surface shapes due to proximity and surface shape geometries.

18 Claims, 14 Drawing Sheets

(56) References Cited

U.S. PATENT DOCUMENTS

2016/0201876 A1    7/2016  Lv et al.

FOREIGN PATENT DOCUMENTS

EP          2645418       10/2013
WO    WO-2009144024 A1    12/2009

OTHER PUBLICATIONS

"International Application Serial No. PCT/US2018/057477, Written Opinion dated Feb. 18, 2019", 6 pgs.

* cited by examiner

Summed Illuminance in Valuation Field

Width ⇑  ⇒ Length

Summed Luminance in Valuation Field

SOURCE SENSITIVE OPTIC WITH RECONFIGURABLE CHIP-ON-BOARD LIGHT EMITTING DIODE ARRAY

FIELD OF INVENTION

This application is related to chip-on-board light emitting diode based lighting.

BACKGROUND

Semiconductor light sources, such as light emitting diodes (LEDs), provide efficient and robust full-spectrum lighting sources. LED-based luminaires or light fixtures are used for interior and exterior applications such as, for example, street lighting. In particular, chip-on-board (CoB) LED arrays provide high luminance combined with narrow-beam light generation to provide tight focusing/low geometric spreading of illumination. CoB LED arrays generally refer to one or more semiconductor chips (or "dies") in which one or more LED junctions are fabricated and where the chip(s) is/are mounted (e.g., adhered) directly to a printed circuit board (PCB). The chip(s) is/are then wire bonded to the PCB, after which a glob of epoxy or plastic may be used to cover the chip(s) and wire connections. One or more such LED assemblies or LED packages in turn may be mounted to a common mounting board or substrate of a lighting fixture.

Optical elements or structures are used together with the CoB LED arrays to facilitate focusing of the generated light to create a narrow-beam of collimated or quasi-collimated light. These optical elements can include, for example, lenses or collimator lenses (collectively "lenses"). These structures capture and redirect light emitted by a light source, e.g. the CoB LED array, to improve its directionality.

Traditional CoB LED array based street lighting use freeform optics, as shown in FIG. 1, as the optical element or lens to disperse light onto the road in a specific pattern. The freeform optics depends on the street or road type (highway, urban, pedestrian, etc) and the regional standard that is applicable. Usually the CoB LED array has a fairly simple luminance distribution (either square, rectangular or circular), and the freeform optics is used to transform the CoB LED array luminance distribution into the specific distribution that is needed for the street. The size of the freeform optic is a function of the light source size. The larger the light source size, the larger the freeform optic size. For CoB LED array based street lighting such freeform optics become large and expensive. Given the large number of streetlight patterns, the number of freeform optics types for a luminaire supplier can become rather excessive. For CoB LED array based street lighting, which is supposed to provide a low cost solution in the market, maintaining inventory and tracking large complicated freeform optics are a market barrier.

SUMMARY

Described herein is a source sensitive optic that uses reconfigurable chip-on-board (CoB) light emitting diode (LED) arrays as light sources. In an implementation, the reconfigurable CoB LED array includes a predetermined number of LEDs that are configurable for a variety of illumination scenarios. In an implementation, the reconfigurable CoB LED array is multiple CoB LED arrays that are configured for use with the source sensitive optic as described herein. The source sensitive optic includes surface shapes that are responsive to the reconfigurable CoB LED array. The source sensitive optic is configured to provide beam profile and radiation pattern differentiation based on a CoB LED array configuration configured from the reconfigurable CoB LED. Each configurable CoB LED array configuration radiates a different beam pattern via the surface shapes due to proximity and surface shape geometries.

BRIEF DESCRIPTION OF THE DRAWINGS

A more detailed understanding may be had from the following description, given by way of example in conjunction with the accompanying drawings wherein.

DETAILED DESCRIPTION

Figure 1:
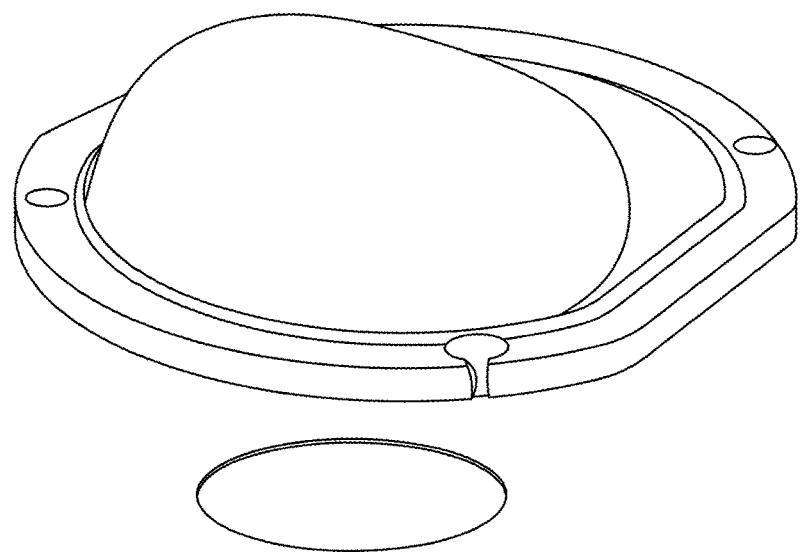
FIG. 1 is an illustration of a freeform for conventional light emitting diode lighting.

It is to be understood that the figures and descriptions for using a source sensitive optic with reconfigurable chip-on-board (CoB) light emitting diode (LED) arrays as light sources have been simplified to illustrate elements that are relevant for a clear understanding, while eliminating, for the purpose of clarity, many other elements found in typical lighting systems and devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

Described herein is a source sensitive optic that uses reconfigurable CoB LED arrays as light sources. In general, for a particular source sensitive optic for a given lighting environment, a reconfigurable CoB LED array is provided. A given lighting environment is meant to include a set of illumination characteristics, features or parameters that can be met by the combination of the particular source sensitive optic and the reconfigurable CoB LED array. FIGS. 10A-10C, 11A-11C and 12A-12C provide illustrative illumination characteristics, features or parameters. The source sensitive optic is designed to take advantage of the reconfigurable CoB LED array and the optic can be implemented using, but is not limited, freeform, refractive, Fresnel and/or reflective type optics or combinations thereof. The source sensitive optic includes surface shapes that are responsive to the reconfigurable CoB LED array.

The reconfigurable CoB LED array includes a predetermined number of LEDs that are configurable for a variety of illumination scenarios. The source sensitive optic is configured to provide beam profile and radiation pattern differentiation based on a CoB LED array configuration configured from the reconfigurable CoB LED. Each configurable CoB LED array configuration radiates a different beam pattern via the surface shapes due to proximity and surface shape geometries. In this implementation, reconfigurable CoB LED array has individually addressable LEDs and/or semiconductor chips.

In another implementation, the reconfigurable CoB LED array can include or refer to multiple, non-configurable CoB LED arrays that are configured for use with the source sensitive optic as described herein. That is, the reconfigurable CoB LED array can include multiple individual CoB products which have specific LED arrangements or configurations. In this implementation, the source sensitive optic is configured to provide beam profile and radiation pattern differentiation based on a set of non-configurable CoB LED arrays. As an illustrative example, the specific LED arrangements can include, but is not limited to, the Type I, II and II light sources described herein. The source sensitive optic is then configured to provide beam profile and radiation pattern differentiation as described herein. In this implementation, each specific LED configuration can be a different product.

Figure 2:
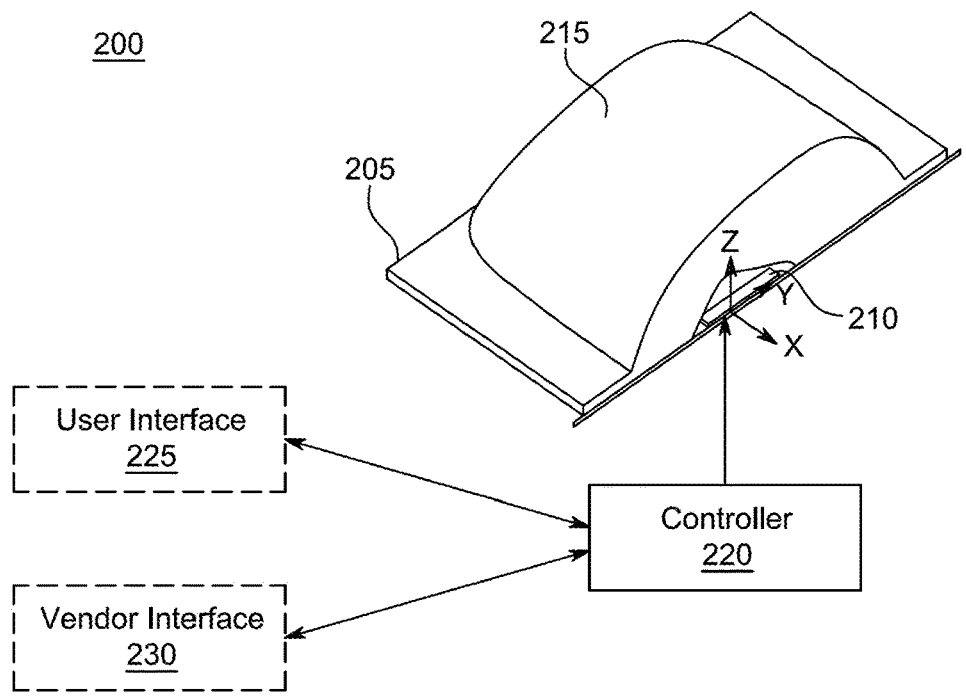
FIG. 2 is an illustrative lighting system in accordance with certain implementations.

FIG. 2 is an illustrative lighting system 200 in accordance with certain implementations. Lighting system 200 includes a light fixture 205 that includes a reconfigurable CoB LED array 210 configured with a source sensitive optic 215. Reconfigurable CoB LED array 210 is in communication with or connected to (collectively "connected to") a controller 220 which in turn is connected to a user interface 225 or vendor interface 230 for configuring reconfigurable CoB LED array 210. The shape and configuration of reconfigurable CoB LED array 210 and source sensitive optic 215 are illustrative and are dependent on a given lighting environment as described herein below.

Operationally, a user or vendor selects source sensitive optic 215 and a reconfigurable CoB LED array 210 for the noted lighting environment. In an implementation, the user and vendor can then use user interface 225 or vendor interface 230, respectively, to select and provide configuration information to controller 220, which in turn configures reconfigurable CoB LED array 210 to provide the requested illumination for the noted lighting environment as described herein below.

Reconfigurable CoB LED array 210 should be understood to include any electroluminescent diode or other type of carrier injection/junction-based system that is capable of generating radiation in response to an electric signal. Reconfigurable CoB LED array 210 includes, but is not limited to, semiconductor-based structures that emit light in response to current, light emitting polymers, organic light emitting diodes (OLEDs), electroluminescent strips, and the like. Reconfigurable CoB LED array 210 can include multiple dies or chips (collectively chips) that can be connected in parallel or series. The chips can be group or individually addressed or controlled. For example, the chips can be configured to respectively emit: different spectra of radiation; different color temperature; different color; or different intensity. In general, different chips can be configured for different illumination characteristics, features or parameters.

Reconfigurable CoB LED array 210 can be configured in a variety of shapes that include, but is not limited to, rectangles, star shapes, and circular shapes. As described herein below with respect to FIG. 3, a given shape of reconfigurable CoB LED array 210 can be controlled or configured with different sub-shapes to provide different illumination and/or radiation patterns. That is, different chips can be configured to be on or off.

Reconfigurable CoB LED array 210 can be configured to generate radiation in a wide spectrum including the infrared spectrum, ultraviolet spectrum, visible spectrum and other areas of the overall electromagnetic spectrum. Reconfigurable CoB LED array 210 can be configured and/or controlled to generate radiation having various bandwidths for a given spectrum (e.g., narrow bandwidth, broad bandwidth). Reconfigurable CoB LED array 210 can be configured to generate radiation in a variety of colors with varying color temperatures. Although color is used interchangeably with spectrum, color generally refers to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light. Color temperature essentially refers to a particular color content or shade (e.g., reddish, bluish) of white light. However, color temperature can also be used with reference to non-white light.

Source sensitive optic 215 is configured to provide beam profile and radiation pattern differentiation based on different surface shapes and each surface shape's interaction with a given configuration for reconfigurable CoB LED array 210. The surface shapes are optimized to meet different environmental and lighting scenarios using different LED configurations available from reconfigurable CoB LED array 210. In an implementation, source sensitive optic 215 is molded from polymethyl methacrylate (PMMA), polycarbonate, glass or any other like material.

Controller 220 can be used to describe various apparatus relating to the operation of reconfigurable CoB LED array 210. Controller 220 can be implemented in numerous ways (e.g., such as with dedicated hardware) to perform various functions discussed herein. For example, controller 220 can be a processor which employs one or more microprocessors that may be programmed using software (e.g., microcode) to perform various functions discussed herein. Controller 220 can be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present disclosure discussed herein. The terms "program" or "computer program" are used herein in a generic sense to refer to any type of computer code (e.g., software or microcode) that can be employed to program one or more processors or controllers.

User interface 225 and/or vendor interface 230 can refer to an interface between a human user or operator and controller 220 to configure reconfigurable CoB LED array 210. User interface 225 and/or vendor interface 230 can be, but is not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

Figure 3:
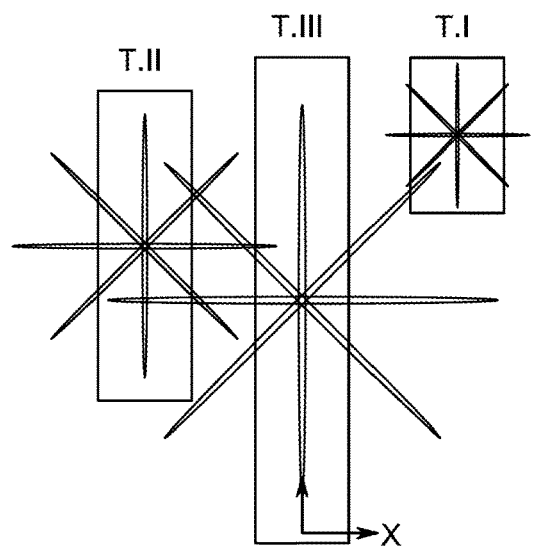
FIG. 3 is an illustrative CoB LED array with Type I, Type II and Type III light source configurations for use in a source sensitive optic as shown in FIG. 7 in accordance with certain implementations.
Figure 7:
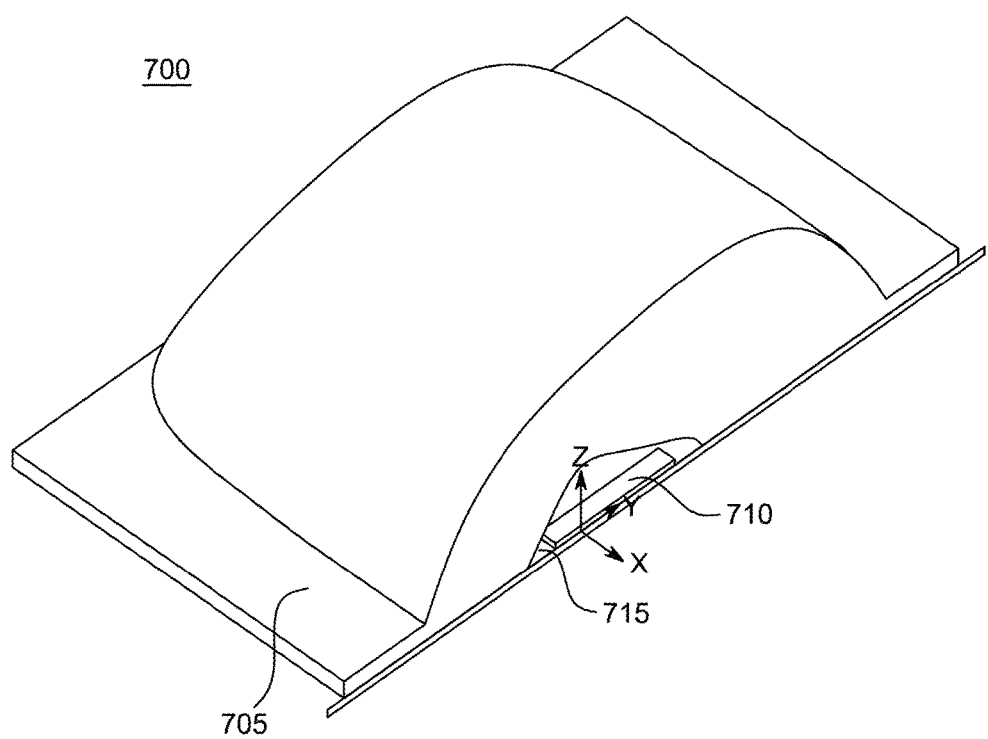
FIG. 7 is an illustrative source sensitive optic in accordance with certain implementations.

FIG. 3 is an illustrative reconfigurable CoB LED array 300 with Type I, Type II and Type III light source configurations for use with a source sensitive optic, such as for example, a source sensitive optic 705 of FIG. 7. In an example implementation, a Type I light source configuration can be a 3×5 mm array that emits emitting 2000 lumens (lm), a Type II light source configuration can be a 3×10 mm array that emits emitting 4000 lm, a Type III light source configuration can be a 3×15.6 mm array that emits emitting 6000 lm. Type I light source configuration emits a narrow beam and each successively larger light source emits wider beams. Characteristics of the Type I, Type II and Type III light source configurations in an example source sensitive optic are shown and described below with respect to FIGS. 10A-10C, 11A-11C and 12A-12C, respectively. In an implementation, as described herein, reconfigurable CoB LED array 300 of FIG. 3 can be three non-configurable CoB LEDs, one for each of the Type I, Type II and Type III light source configurations.

In an implementation of reconfigurable CoB LED array 300 of FIG. 3, Type III light source configuration can be used as a base configuration from which other configurations, such as the Type I and Type II configurations can be implemented from. As shown on the Type III configuration, there is an example X, Y and Z indication on the Type III configuration. The Type I and Type II configurations are configured relative to the X, Y and Z axis indication. In an implementation, each configuration is centered on the X axis and different sets of chips in reconfigurable CoB LED array 300 are configured along the Y axis. In an implementation, each configuration is centered on the X axis and chips in reconfigurable CoB LED array 300 are configured along the Z axis. In an implementation, each configuration is centered on the X axis and chips in reconfigurable CoB LED array 300 are configured along the Y and Z axes. The shape of reconfigurable CoB LED array 300 is illustrative and other shapes can be used as described herein. Different configurations can provide different illumination characteristics, features or parameters as described herein.

Figure 4:
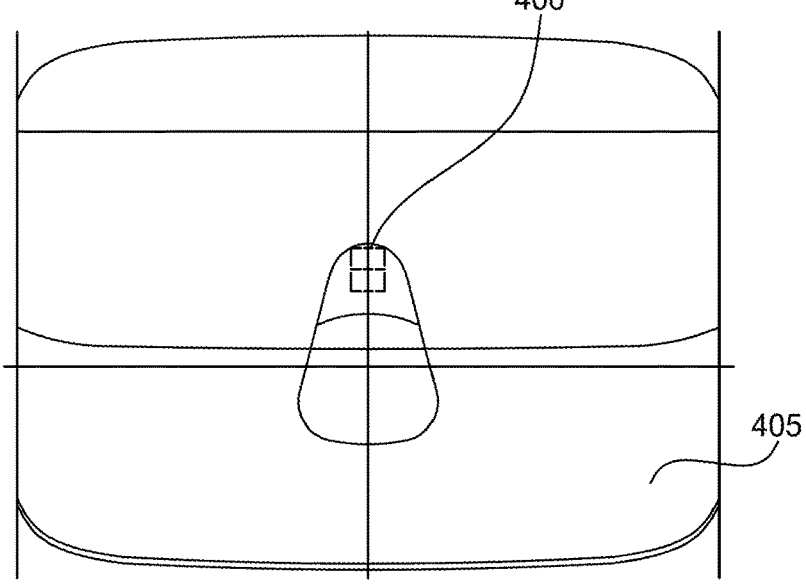
FIG. 4 is an illustrative wireframe diagram of a Type I light source in a source sensitive optic accordance with certain implementations.
Figure 5:
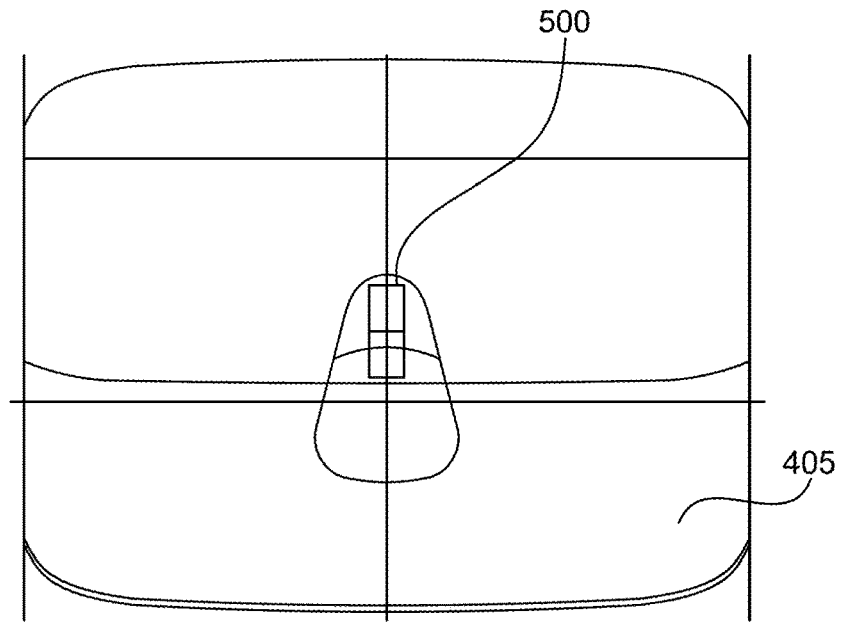
FIG. 5 is an illustrative wireframe diagram of a Type II light source in a source sensitive optic in accordance with certain implementations.
Figure 6:
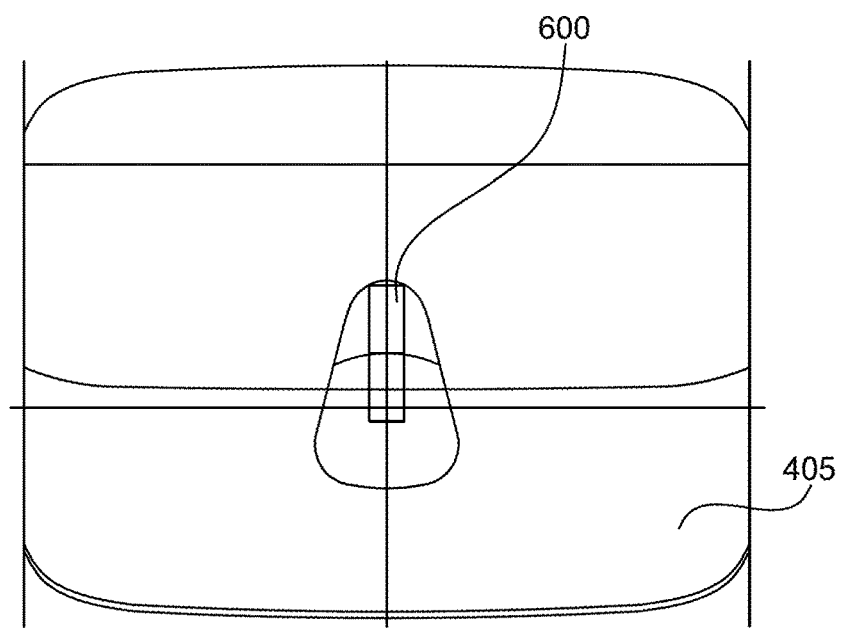
FIG. 6 is an illustrative wireframe diagram of a Type III light source in a source sensitive optic in accordance with certain implementations.

The Type I, Type II and Type III relative configurations are illustrated with respect to FIGS. 4-6. FIG. 4 is an illustrative wireframe diagram of a Type I light source 400 in a source sensitive optic 405. FIG. 5 is an illustrative wireframe diagram of a Type II light source 500 in source sensitive optic 405. FIG. 6 is an illustrative wireframe diagram of a Type III light source 600 in source sensitive optic 405. In an implementation, Type I light source 400 and Type II light source 500 are subsets of Type III light source 600 along the Y axis. In general, each of the Type I, Type II and Type III relative configurations can be used with source sensitive optic 405.

Figure 8:
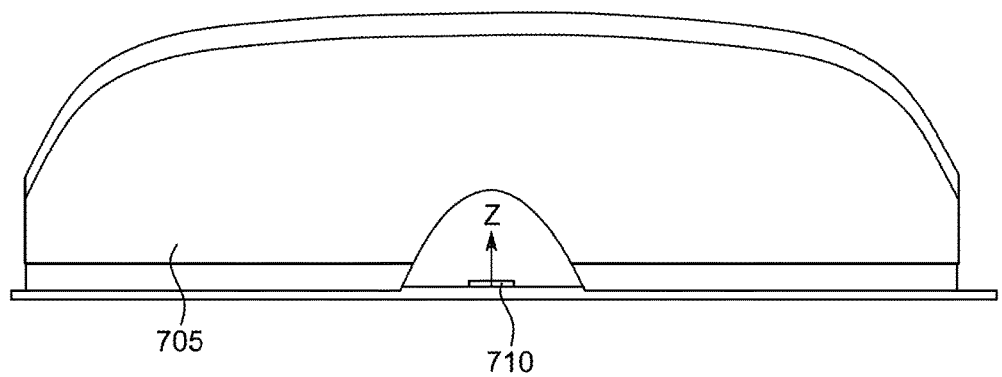
FIG. 8 is an illustrative cross section of the source sensitive optic for light source of FIG. 3 in accordance with certain implementations.
Figure 9:
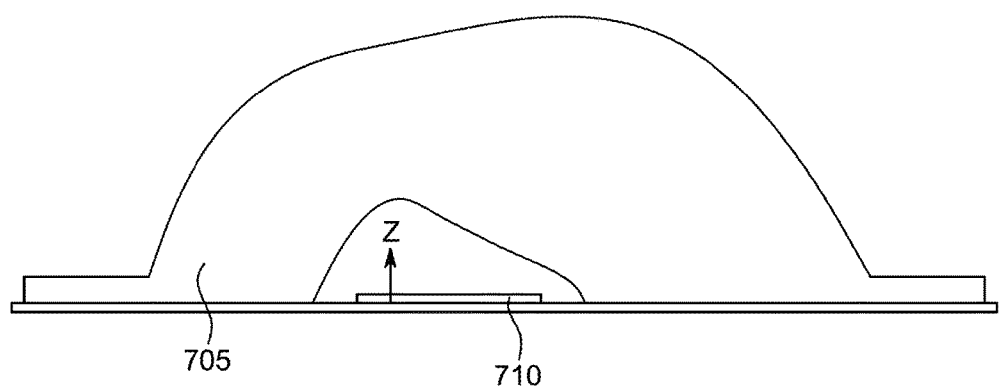
FIG. 9 is another illustrative cross section of the source sensitive optic of FIG. 4 in accordance with certain implementations.

FIG. 7 is an illustrative lighting fixture 700 that includes a source sensitive optic 705 and a CoB LED array 710 that are mounted on a mounting board 715. In an implementation, source sensitive optic 705 is mounted after mounting of CoB LED array 710 on mounting board 715. Source sensitive optic 705 is configured to provide different beam profiles and radiation patterns based on the different shapes and configurations of CoB LED array 710. A controller, such as for example, controller 220 can be used to configure CoB LED array 710 as appropriate. In an implementation, a controller is not needed if CoB LED array 710 includes multiple non-configurable CoB LED arrays as described herein. FIG. 8 is an illustrative cross section of light fixture 700 taken along the X-Z axes. FIG. 9 is an illustrative cross section of light fixture 700 taken along the Y-Z axes.

Figure 10A:
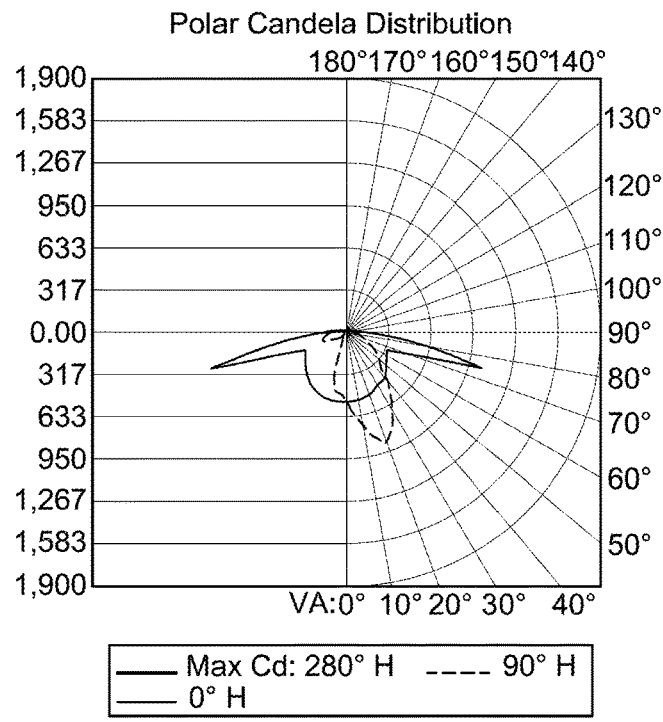
FIGS. 10A-10C are beam profiles for Type I, II and III lighting sources in accordance with certain implementations.
Figure 10B:
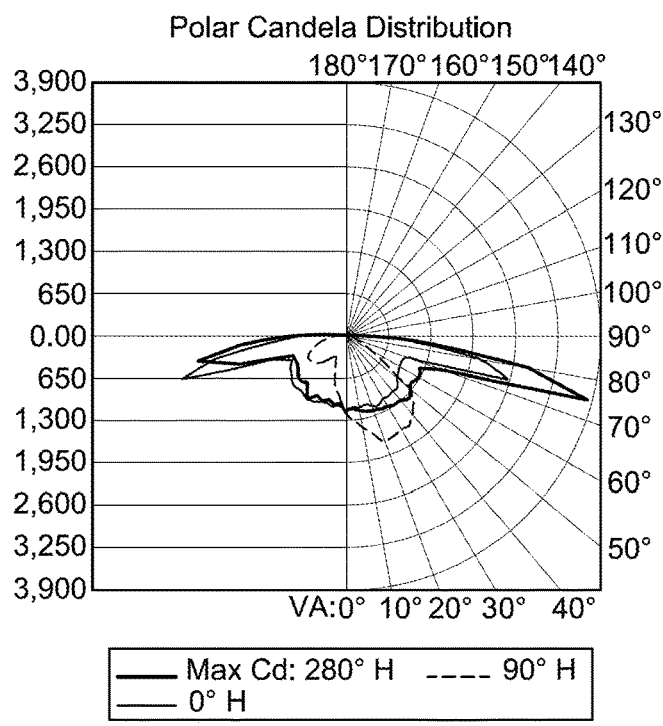
Figure 10C:
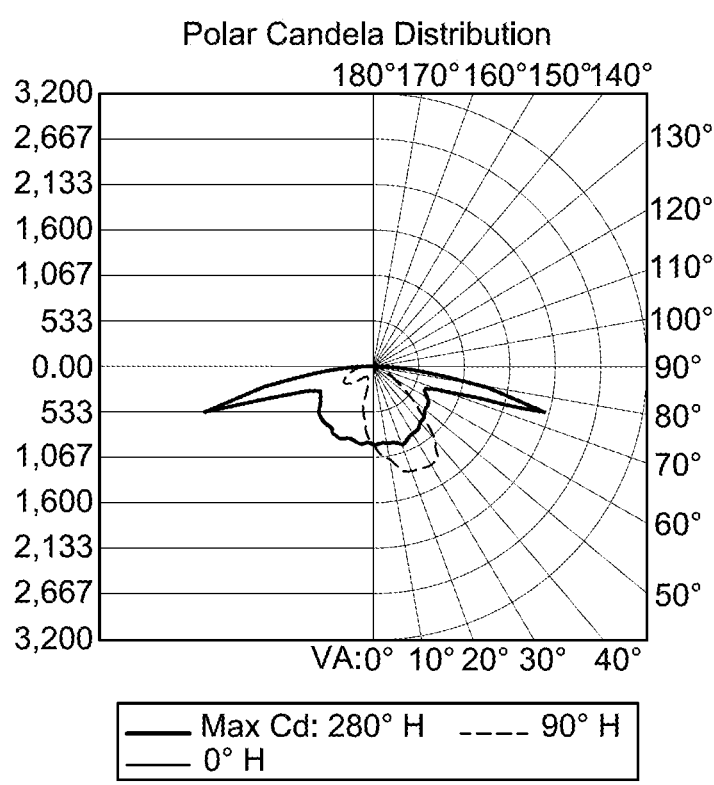
Figure 11A:
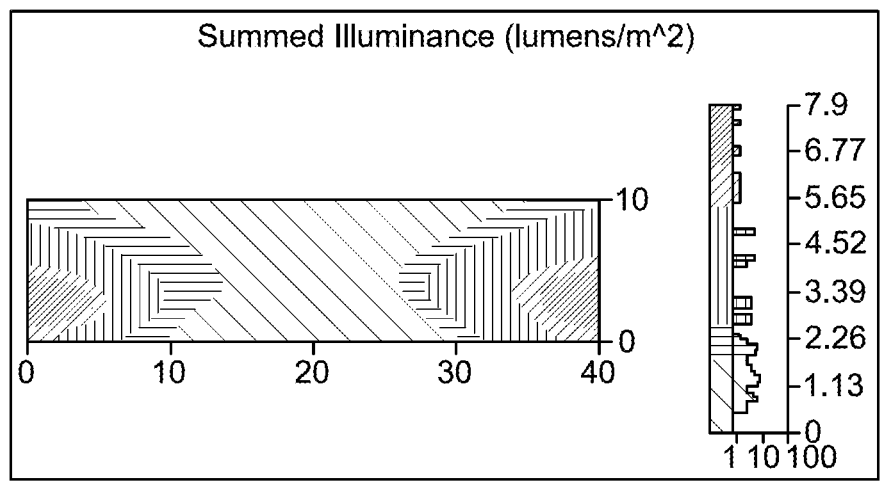
FIGS. 11A-11C are luminance flux characteristics for Type I, II and III lighting sources in accordance with certain implementations.
Figure 11A:
Figure 11A:
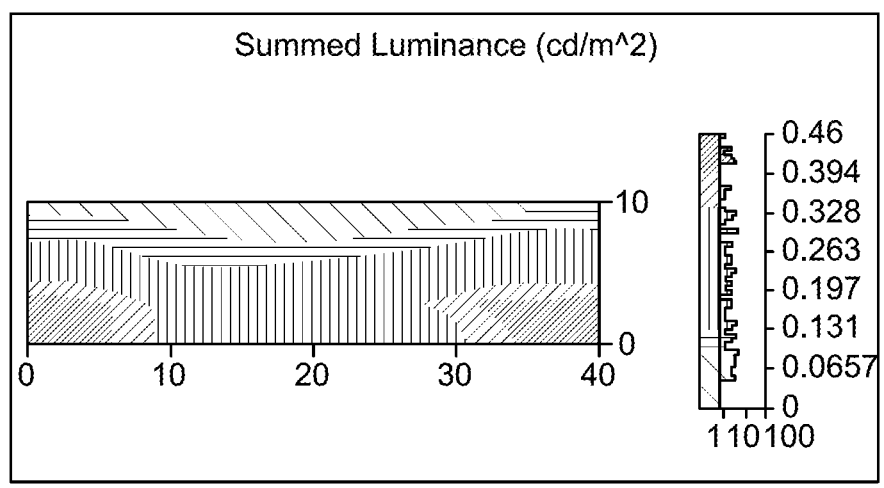
Figure 11B:
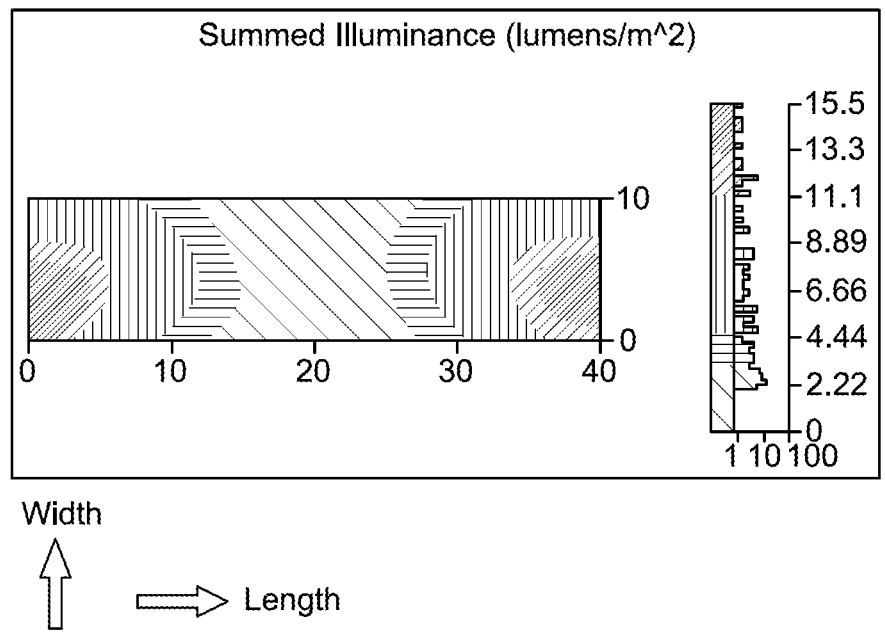
Figure 11B:
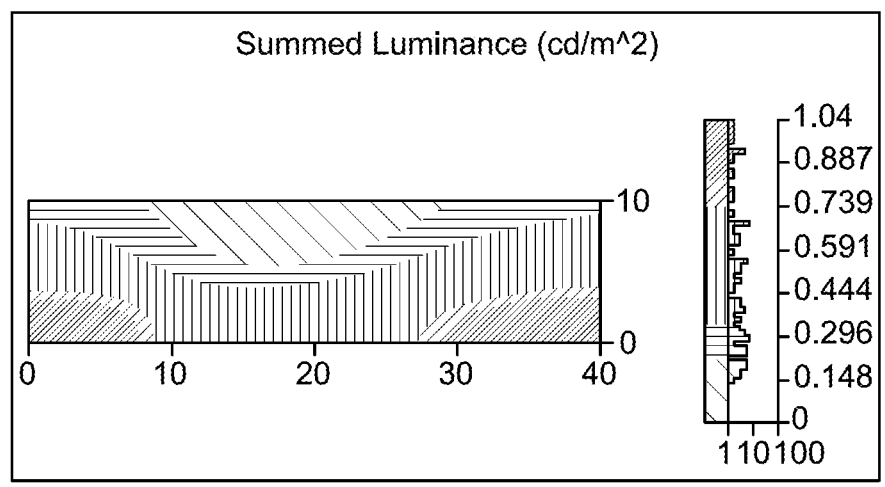
Figure 11C:
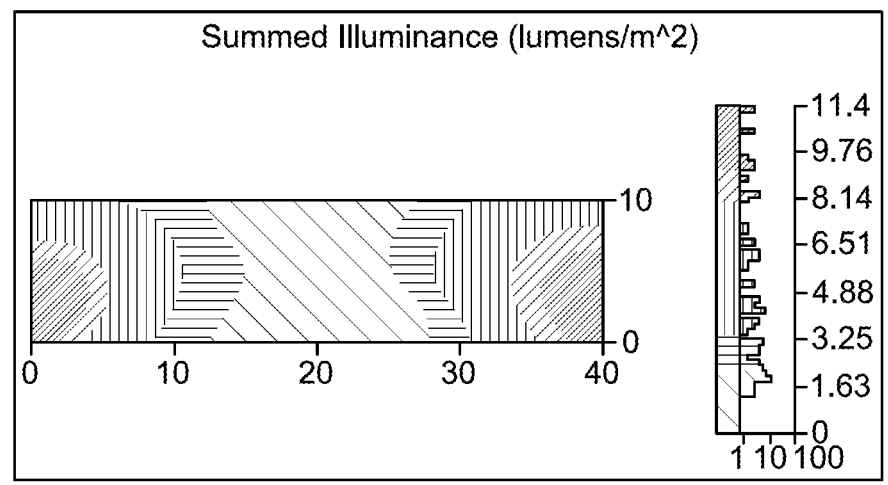
Figure 11C:
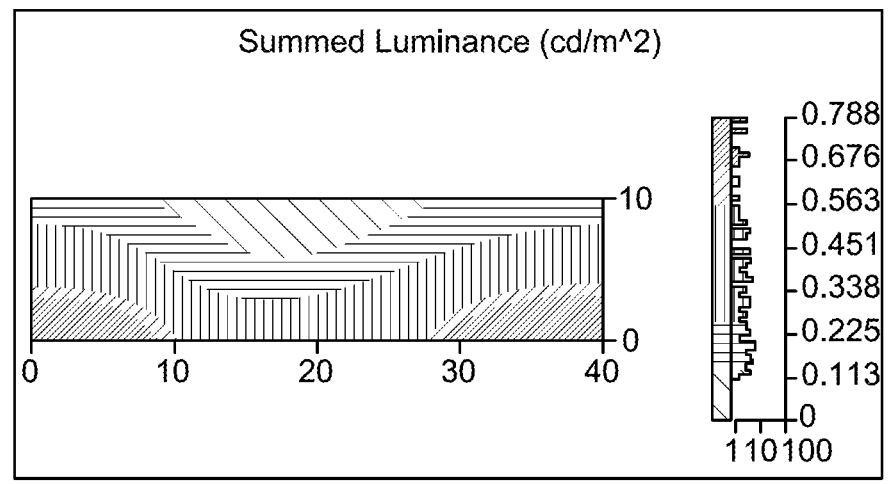
Figure 12A:
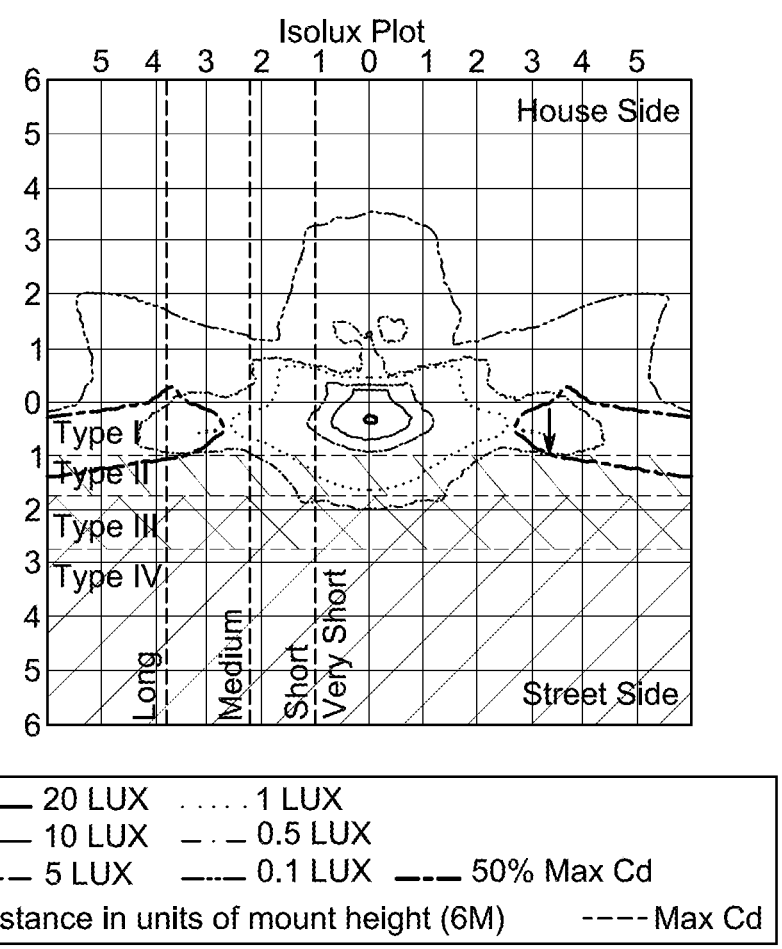
FIGS. 12A-12C are luminous intensity plots for Type I, II and III lighting sources in accordance with certain implementations.
Figure 12B:
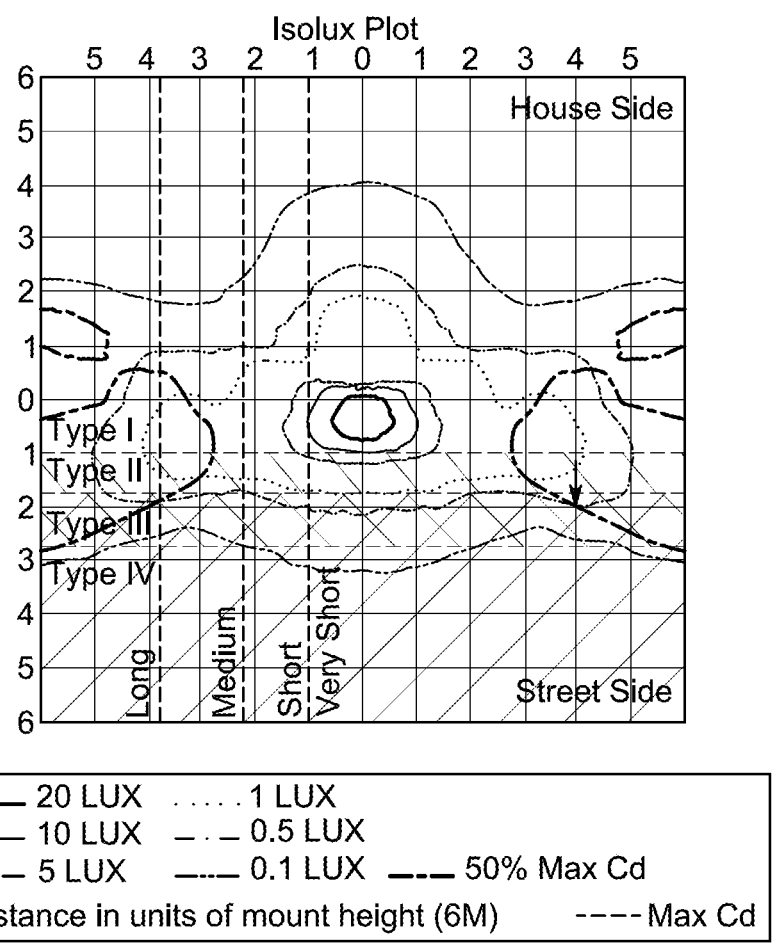
Figure 12C:
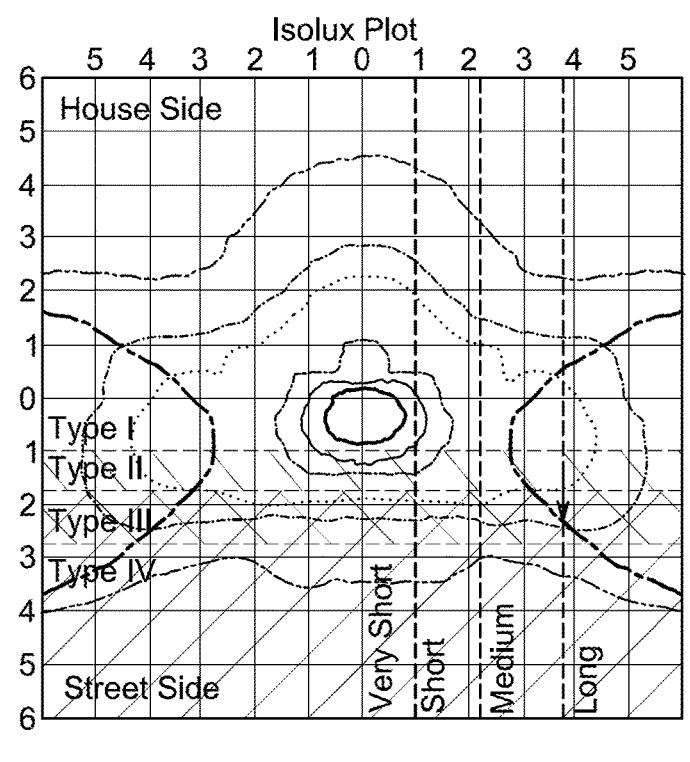

FIGS. 10A-10C illustrate beam patterns with respect to Type I, Type II and Type III lighting source configurations in accordance with certain implementations. As illustrated, the Type I lighting source has a narrow beam profile centered at 20 degrees, (along 90° H, which means along the width of the road), and the Type II lighting source and the Type III lighting source have wider beam profiles. FIGS. 11A-11C illustrate Illuminance and Luminance profiles on an example road configuration with respect to Type I, Type II and Type III lighting source configurations in accordance with certain implementations. FIGS. 12A-12C illustrate luminous intensity plots with respect to Type I, Type II and Type III lighting source configurations in accordance with certain implementations. FIGS. 12A-12C demonstrate that maximum intensity (Max Cd point) of the three distributions is changing and that the 50% of Max Cd points (see isoplot curve) are getting wider, (notably along the street side as noted in the figures), when the shape of the CoB is changed. The beam profile is getting wider from FIGS. 12A to FIG. 12C when using, for example, Type I to Type III lighting source configurations, respectively.

Figure 13:
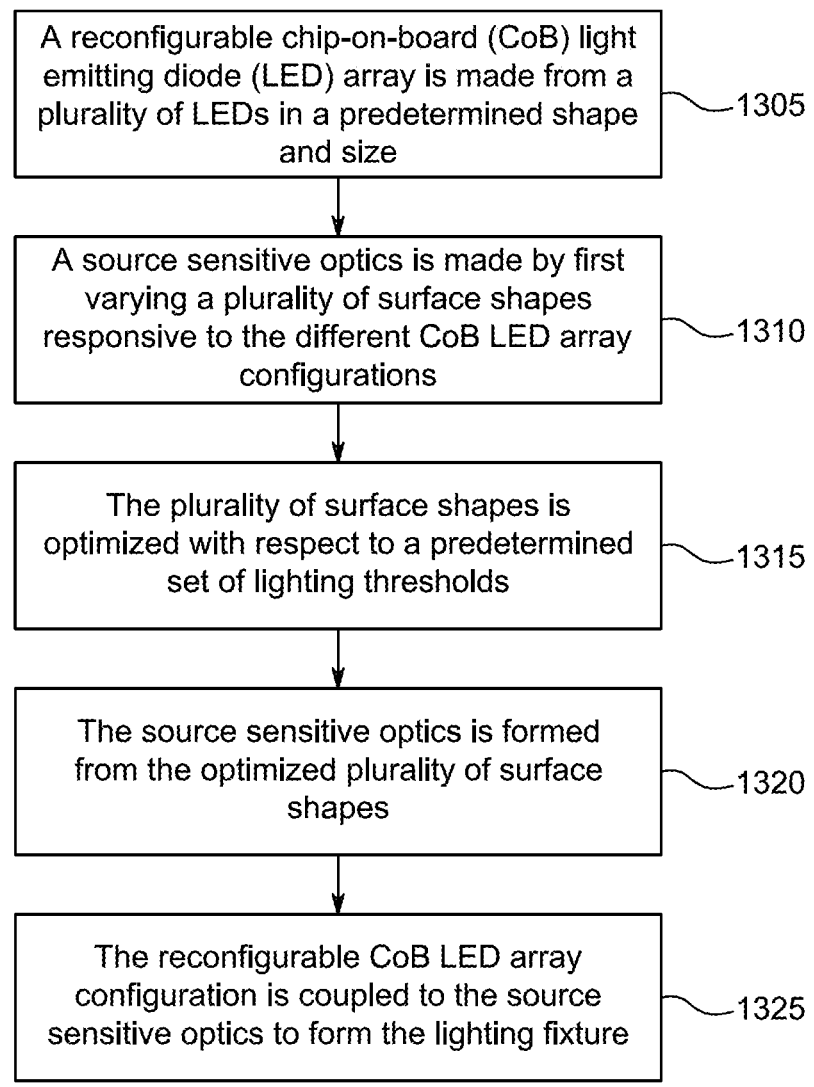
FIG. 13 is a flowchart for making a lighting fixture in accordance with certain implementations.

FIG. 13 is a flowchart 1300 for making a lighting fixture in accordance with certain implementations. A reconfigurable CoB LED array is made from a plurality of LEDs in a predetermined shape and size (1305). A source sensitive optic is made by first varying a plurality of surface shapes responsive to different CoB LED array configurations of the reconfigurable CoB LED array (1310). In an implementation, the reconfigurable CoB LED array is a plurality of non-configurable CoB LED arrays and the source sensitive optic is made by varying the plurality of surface shapes responsive to each non-configurable CoB LED array configuration. The plurality of surface shapes is optimized with respect to a predetermined set of lighting thresholds (1315). The predetermined lighting thresholds can include, but is not limited to, beam profiles, radiation patterns, luminance flux, luminous intensity, color, and beam width. The source sensitive optic is formed from the optimized plurality of surface shapes (1320). The reconfigurable CoB LED array configuration is coupled to the source sensitive optic to form the lighting fixture (1325).

The embodiments described herein may be incorporated into any suitable light emitting device. Embodiments of the invention are not limited to the particular structures illustrated, such as, for example, the system and devices of FIGS. 2-9.

The non-limiting methods described herein for using source sensitive optics with reconfigurable CoB LED arrays as light sources may be modified for a variety of applications and uses while remaining within the spirit and scope of the claims The implementations and variations described herein, and/or shown in the drawings, are presented by way of example only and are not limiting as to the scope and spirit. The descriptions herein may be applicable to all implementations of using a source sensitive optic with reconfigurable CoB LED arrays as light sources although it may be described with respect to a particular implementation.

In general, a lighting fixture includes a reconfigurable chip-on-board (CoB) light emitting diode (LED) array and a source sensitive optic including a plurality of surface shapes, the source sensitive optics providing different beam profiles and radiation patterns based on the plurality of surface shapes in combination with different CoB LED array configurations available from the reconfigurable CoB LED array. In an implementation, the reconfigurable CoB LED array includes a plurality of LEDs which are individually addressable and selectable via a controller. In an implementation, the reconfigurable CoB LED array includes a base CoB LED array configuration. In an implementation, the source sensitive optic is at least one of a freeform, refractive, Fresnel, and reflective type optic. In an implementation, the source sensitive optic is molded from at least one of polymethyl methacrylate (PMMA), polycarbonate, and glass. In an implementation, the at least one of the plurality of surface shapes has a different surface shape. In an implementation, the at least one of the plurality of surface shapes has a different geometrical relationship to at least one LED of the reconfigurable CoB LED array. In an implementation, the reconfigurable CoB LED array includes a plurality of non-configurable CoB LED arrays. In an implementation, each of the different CoB LED array configurations is a non-configurable CoB LED array. In an implementation, the different beam profiles and radiation patterns vary in terms of at least one of luminance flux, luminous intensity, color, and beam width.

In general, a method for making a lighting fixture includes providing a reconfigurable chip-on-board (CoB) light emitting diode (LED) array and providing a source sensitive optic which includes a plurality of surface shapes, the source sensitive optic providing different beam profiles and radiation patterns based on the plurality of surface shapes in combination with different CoB LED array configurations available from the reconfigurable CoB LED array. The method further includes coupling the reconfigurable CoB LED array with the source sensitive optic to form the lighting fixture. In an implementation, providing the source sensitive optic further includes varying the plurality of surface shapes responsive to the different CoB LED array configurations, optimizing the plurality of surface shapes with respect to a predetermined set of lighting thresholds, and forming the source sensitive optic from the plurality of surface shapes. In an implementation, providing the reconfigurable CoB LED array includes forming the reconfigurable CoB LED array from a plurality of LEDs which are individually addressable and selectable. In an implementation, the reconfigurable CoB LED array including a base CoB LED array configuration. In an implementation, the reconfigurable CoB LED array includes a plurality of non-configurable CoB LED arrays. In an implementation, each of the different CoB LED array configurations is a non-configurable CoB LED array. In an implementation, providing a source sensitive optics includes using at least one of a freeform, refractive, Fresnel, and reflective type optics to implement the source sensitive optics. In an implementation, providing a source sensitive optic includes molding the source sensitive optic from at least one of polymethyl methacrylate (PMMA), plastic, polycarbonate, and glass. In an implementation, at least one of the plurality of surface shapes has a different surface shape. In an implementation, at least one of the plurality of surface shapes has a different geometrical relationship to at least one LED of the reconfigurable CoB LED array.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of using a source sensitive optic with reconfigurable CoB LED arrays as light sources as described herein, and are considered to be within the full scope of the invention.

Some features of some implementations may be omitted or implemented with other implementations. The device elements and method elements described herein may be interchangeable and used in or omitted from any of the examples or implementations described herein.

Although features and elements are described above in particular combinations, each feature or element can be used alone without the other features and elements or in various combinations with or without other features and elements.

What is claimed is:

1. A lighting fixture, comprising:
    a chip-on-board (CoB) light emitting diode (LED) array having an LED configuration selected from a plurality of LED configurations; and
    an optic comprising a plurality of surface shapes, the optic providing different beam profiles and radiation patterns based on the plurality of surface shapes and the LED configuration selected from the plurality of LED configurations.

2. The lighting fixture of claim 1, wherein the CoB LED array including a plurality of LEDs which are individually addressable and selectable via a controller.

3. The lighting fixture of claim 2, wherein the optic is at least one of a freeform, refractive, Fresnel, and reflective type optic.

4. The lighting fixture of claim 3, wherein the optic is molded from at least one of polymethyl methacrylate (PMMA), polycarbonate, and glass.

5. The lighting fixture of claim 1, wherein at least one of the plurality of surface shapes has a different surface shape.

6. The lighting fixture of claim 5, wherein at least one of the plurality of surface shapes has a different geometrical relationship to at least one LED of the CoB LED array.

7. The lighting fixture of claim 1, wherein the CoB LED array comprises a plurality of CoB LED arrays, each CoB LED array of the plurality of CoB LED arrays having a predetermined shape and size.

8. The lighting fixture of claim 1, wherein each LED configuration of the plurality of LED configurations of the CoB LED array is a CoB LED array having a predetermined shape and size.

9. The lighting fixture of claim 1, wherein the different beam profiles and radiation patterns vary in terms of at least one of luminance flux, luminous intensity, color, and beam width.

10. A method for making a lighting fixture, comprising:
providing a chip-on-board (CoB) light emitting diode (LED) array having an LED configuration selected from a plurality of LED configurations;
providing an optic comprising a plurality of surface shapes, the optic providing different beam profiles and radiation patterns based on the plurality of surface shapes and the LED configuration selected from the plurality of LED configurations; and
coupling the CoB LED array and the optic to form the lighting fixture.

11. The method of claim 10, wherein the providing the optic further comprises:
varying the plurality of surface shapes;
optimizing the plurality of surface shapes with respect to a predetermined set of lighting thresholds; and
forming the optic from the plurality of surface shapes.

12. The method of claim 11, wherein at least one of the plurality of surface shapes has a different surface shape.

13. The method of claim 11, wherein at least one of the plurality of surface shapes has a different geometrical relationship to at least one LED of the CoB LED array.

14. The method of claim 10, wherein the providing the CoB LED array further comprises:
forming the CoB LED array from a plurality of LEDs which are individually addressable and selectable.

15. The method of claim 10, wherein the CoB LED array comprises a plurality of CoB LED arrays, each CoB LED array of the plurality of CoB LED arrays having a predetermined shape and size.

16. The method of claim 15, wherein the providing an optic further comprises:
molding the optic from at least one of polymethyl methacrylate (PMMA), plastic, polycarbonate, and glass.

17. The method of claim 10, wherein each LED configuration of the plurality of LED configurations of the CoB array is a CoB LED array having a predetermined shape and size.

18. The method of claim 10, the providing an optic further comprising:
using at least one of a freeform, refractive, Fresnel, and reflective type optics to implement the optic.

* * * * *